(12) United States Patent
Sakai et al.

(10) Patent No.: US 6,250,165 B1
(45) Date of Patent: Jun. 26, 2001

(54) SEMICONDUCTOR PHYSICAL QUANTITY SENSOR

(75) Inventors: Minekazu Sakai, Kariya; Inao Toyoda, Okazaki; Minoru Murata, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/239,781

(22) Filed: Jan. 29, 1999

(30) Foreign Application Priority Data

Feb. 2, 1998 (JP) .................................................. 10-021343
Feb. 2, 1998 (JP) .................................................. 10-021344

(51) Int. Cl.⁷ .................................. G01L 9/00; G01L 9/16
(52) U.S. Cl. ................................................................ 73/754
(58) Field of Search ............................... 73/754, 720–727, 73/756; 438/478, 479, 652, 689, 697

(56) References Cited

U.S. PATENT DOCUMENTS

| | | | |
|---|---|---|---|
| 5,163,329 | 11/1992 | Shimaoka et al. | 73/721 |
| 5,242,533 | 9/1993 | Trah et al. | 156/628 |
| 5,525,549 | 6/1996 | Fukada et al. | 437/228 |
| 5,546,227 | 8/1996 | Yasugaki et al. | 359/630 |
| 5,616,523 | 4/1997 | Benz et al. | 438/50 |
| 5,643,803 | * 7/1997 | Fukada et al. | 437/15 |
| 5,738,731 | * 4/1998 | Shindo et al. | 136/249 |
| 6,137,120 | * 10/2000 | Shindo et al. | 257/347 |

FOREIGN PATENT DOCUMENTS

| | | |
|---|---|---|
| 61-084537 | 4/1986 | (JP) . |
| 61-220596 | 9/1986 | (JP) . |
| 62-67880 | 3/1987 | (JP) . |
| 63-308390 | 12/1988 | (JP) . |
| 2-309259 | 12/1990 | (JP) . |
| 5-63209 | 3/1993 | (JP) . |
| 6-45618 | 2/1994 | (JP) . |
| 6-123631 | 5/1994 | (JP) . |
| 9-92909 | 4/1997 | (JP) . |
| 9-145740 | 6/1997 | (JP) . |
| 9-153627 | 6/1997 | (JP) . |
| 9-211022 | 8/1997 | (JP) . |
| 10-135484 | 5/1998 | (JP) . |

* cited by examiner

Primary Examiner—William Oen
(74) Attorney, Agent, or Firm—Pillsbury Winthrop LLP

(57) ABSTRACT

A semiconductor physical quantity sensor has a P-type semiconductor substrate and an N-type semiconductor layer formed on a main surface of the P-type semiconductor substrate. A displaceable portion is formed by electrochemically etching the P-type semiconductor substrate from a side of the main surface. At that time, a buried insulation film formed to penetrate the N-type semiconductor layer and to extend into the P-type semiconductor substrate is used as a stopper for the etching. Accordingly, an etched region can be restricted by the buried insulation film, so that the displaceable portion can be precisely formed.

10 Claims, 15 Drawing Sheets

SEMICONDUCTOR PHYSICAL QUANTITY SENSOR

CROSS REFERENCE TO RELATED APPLICATIONS

This application is based upon and claims the benefit of priority of the prior Japanese Patent Applications No. 10-21343, filed on Feb. 2, 1998, and No. 10-21344, filed on Feb. 2, 1998.

BACKGROUND OF THE INVENTION

1. Field of the Invention

This invention relates to a semiconductor sensor for detecting a physical quantity such as acceleration, pressure, vibration, or angular speed, and to a method of manufacturing the semiconductor sensor.

2. Description of the Related Art

JP-A-9-211022 disclosed this kind of semiconductor physical quantity sensor formed through steps of forming an SOI substrate from two silicon substrates by bonding, forming trenches in the SOI substrate at an upper silicon substrate side, and carrying out sacrifice layer etching to form a beam structure with a movable electrode. In this method using the SOI substrate, however, it is necessary to additionally perform steps of forming a wiring pattern on a lower side silicon substrate before bonding, flattening a surface of one of the substrates for the bonding, polishing the upper side silicon substrate after the bonding, and the like, resulting in complicated processes.

On the other hand, JP-A-6-123631 discloses a method of manufacturing an angular speed sensor having a movable portion. Specifically, a wafer composed of a silicon substrate on which an N-type epitaxial layer is formed and in which a P-type buried layer is formed is prepared. Then, trenches are formed in the N-type epitaxial layer with a specific pattern, and the P-type buried layer is removed by electrochemical etching through the trenches so that the movable portion is formed. In this method, because the sensor dispenses with an SOI substrate, the manufacturing process is simplified. However, the wafer composed of the silicon substrate on which the N-type epitaxial layer is formed and in which the P-type buried layer is formed must be utilized.

When this kind of semiconductor physical quantity sensor is formed by electrochemical etching, a wafer composed of a P-type silicon substrate on which the N-type epitaxial layer is formed can be used. For example, when a semiconductor pressure sensor is manufactured from the wafer, a diaphragm for the pressure sensor can be formed by electrochemically etching the wafer from a wafer back surface.

It is also possible to manufacture the acceleration sensor having the same structure as that disclosed in JP-A-9-211022 from the wafer including the P-type silicon substrate on which the N-type epitaxial layer is formed. Specifically, after trenches are formed in the wafer on a front surface side, electrochemical etching is carried out on the wafer from the front surface side so that the movable portion of the sensor is formed. At that time, however, the N-type epitaxial layer is not etched and the P-type silicon substrate is etched. Therefore, it is difficult to precisely control etching conditions such as etching time for accurately forming the movable portion.

In addition, when the electrochemical etching step is carried out on the wafer, the wafer is immersed into an anisotropic etching solution, and a positive voltage is applied to the N-type epitaxial layer so that only the P-type silicon substrate is etched. Therefore, it is necessary to form wiring segments within respective chips for applying the positive voltage to the N-type epitaxial layer during the electrochemical etching step. This makes an area of each chip large.

SUMMARY OF THE INVENTION

The present invention has been made in view of the above problems. A first object of the present invention is to provide a semiconductor physical quantity sensor including a movable portion (displaceable portion) which is accurately formed by electrochemically etching a substrate. A second object is to reduce an area of a wiring segment used for electrochemically etching a substrate when a displaceable portion is formed.

To achieve the first object described above, in a semiconductor physical quantity sensor according to the present invention, an N-type semiconductor layer is formed on a main surface of the P-type semiconductor substrate, and a displaceable portion is formed by electrochemically etching the P-type semiconductor substrate from a side of the main surface. At that time, a buried insulation film formed to penetrate the N-type semiconductor layer and to extend into the P-type semiconductor substrate is used as a stopper for the etching. Accordingly, an etched region can be controlled by the buried insulation film, so that the displaceable portion can be precisely formed.

The displaceable portion can be formed to be electrically isolated from the P-type silicon substrate. Accordingly, current leak from the displaceable portion does not occur, resulting in high sensing accuracy.

To achieve the second object described above, when a wafer composed of a P-type semiconductor substrate and an N-type semiconductor layer formed on the P-type semiconductor substrate is used to manufacture the semiconductor physical quantity sensor, a pad for outputting an output signal of the sensor is formed to be electrically connected to the N-type semiconductor layer and an etching wiring segment is formed along a scribe line to be electrically connected to the pad. Then, the P-type semiconductor substrate is electrochemically etched while applying an etching voltage to the N-type semiconductor layer through the etching wiring segment and the pad. After that, the wafer is cut along the scribe line. Thus, because the pad necessary for the physical quantity sensor is used for applying the etching voltage to the N-type semiconductor layer, resulting in decreased chip area. In this case, a buried insulation film may be formed to penetrate the N-type semiconductor layer and to extend into the P-type semiconductor substrate. Accordingly, the P-type semiconductor substrate can be electrochemically etched using the buried insulation film as a stopper.

BRIEF DESCRIPTION OF THE DRAWINGS

Other objects and features of the present invention will become more readily apparent from a better understanding of the preferred embodiments described below with reference to the following drawings;

FIGS. 3A–3D and 4A–4D are cross-sectional views showing a manufacturing process of the semiconductor acceleration sensor in a stepwise manner in the first embodiment;

DETAILED DESCRIPTION OF THE PREFERRED EMBODIMENTS (First Embodiment)

Figure 1:
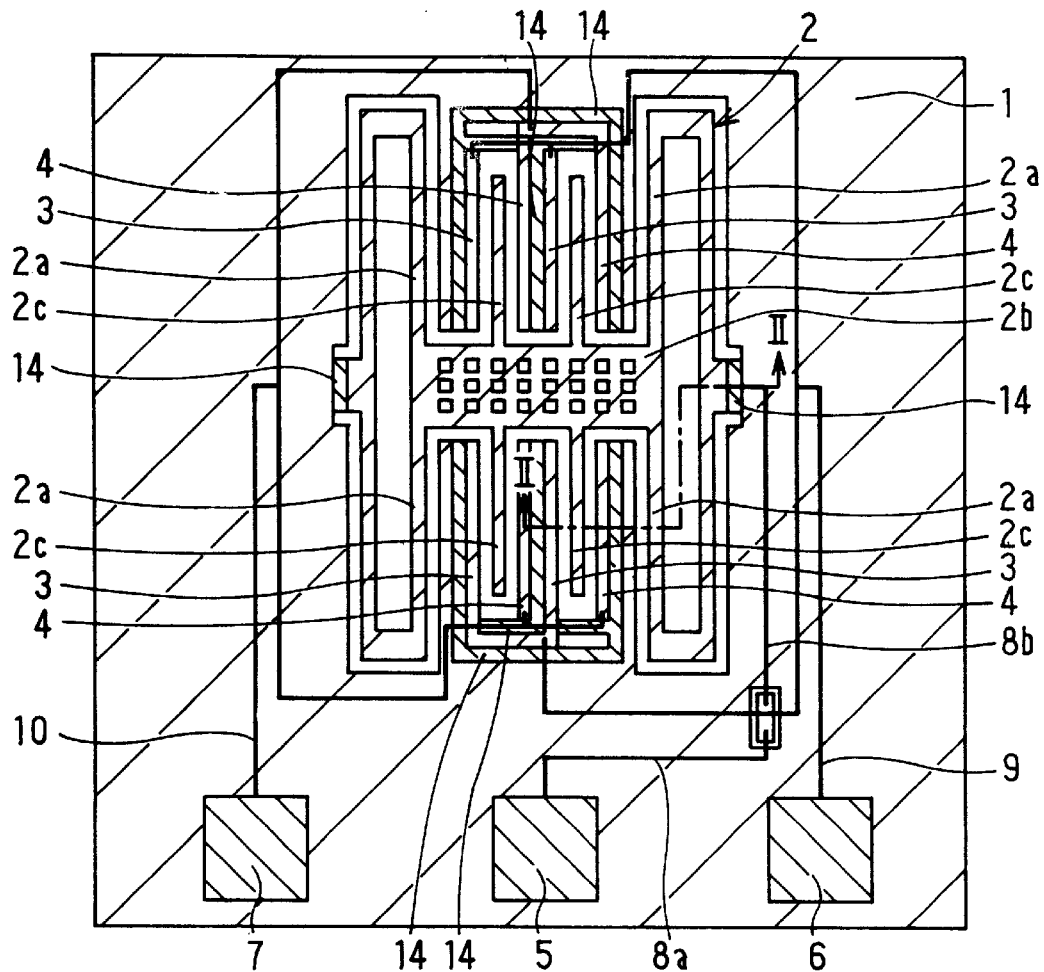
FIG. 1 is a plan view showing a semiconductor acceleration sensor in a first preferred embodiment.

Referring to FIG. 1, a semiconductor acceleration sensor in a first preferred embodiment has a beam structure (displaceable portion) 2 which is formed by etching a substrate 1. The beam structure 2 has beam portions 2a, a weight portion (mass portion) 2b, and several movable electrodes 2c provided on both sides of the weight portion 2b. When acceleration is produced in a right and left direction in the figure, the weight portion 2b is displaced by the acceleration. Each of the movable electrodes 2c is opposed to fixed electrodes 3, 4 on both sides in the right and left direction.

Aluminum pads 5, 6, 7 and wiring segments 8a, 8b, 9, 10 are disposed on the substrate 1. The pad 5 is electrically connected to the movable electrodes 2c through the wiring segments 8a, 8b, and the pad 6 is electrically connected to the fixed electrodes 3 through the wiring segment 9. Further, the pad 7 is electrically connected to the fixed electrodes 4 through the wiring segment 10. The pads 5, 6, 7 are further connected to circuit portions, which are not shown, by wire bonding.

Figure 2:
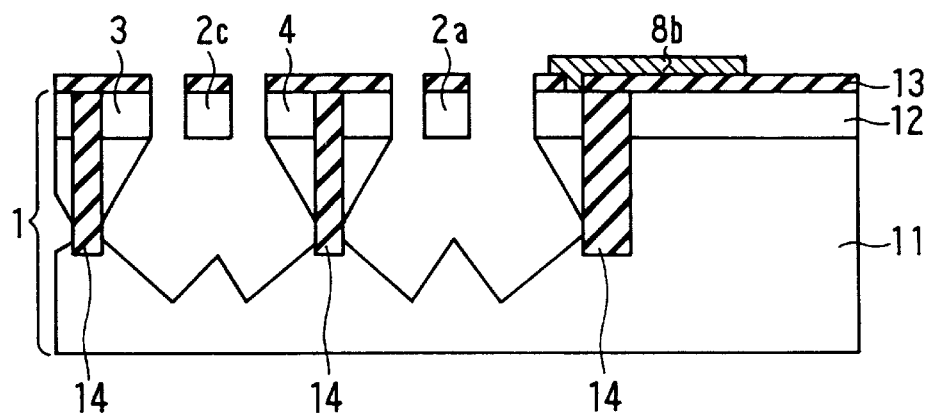
FIG. 2 is a cross-sectional view taken along a II—II line in FIG. 1.

The substrate 1 is, as shown in FIG. 2, composed of a P-type silicon substrate 11, an N-type epitaxial layer 12 and an oxide film 13, which are formed on the P-type silicon substrate 11 in this order. A buried insulation film 14 for providing element isolation regions is selectively formed at a base portion (anchor portion) of the beam structure 2 and at portions where the fixed electrodes 3, 4 are formed. The beam structure 2 and the fixed electrodes 3, 4 are formed by electrochemical etching using the buried insulation film 14 as a stopper. The beam structure 2 and the fixed electrodes 3, 4 are supported (fixed) by the buried insulation film 4 and are electrically isolated from the P-type silicon substrate 11.

In the construction described above, when the weight portion 2b is displaced upon receiving the acceleration, the movable electrodes 2c are displaced correspondingly to that. Each of the movable electrodes 2c and each of the fixed electrodes 3, 4 provides a differential capacity therebetween, and the capacity changes in response to the displacement of the movable electrodes 2c. The acceleration is detected by detecting the change in capacity. For example, the acceleration can be detected by a servo control in which the change in capacity is detected and a feedback voltage is applied to the movable electrodes 2c so that the movable electrodes 2c are held at specific positions.

Next, a manufacturing method of the acceleration sensor will be explained referring to FIGS. 3 and 4. The process drawings of FIGS. 3, 4 are cross-sectional views taken along the same line as that of FIG. 2.

Figure 3A:
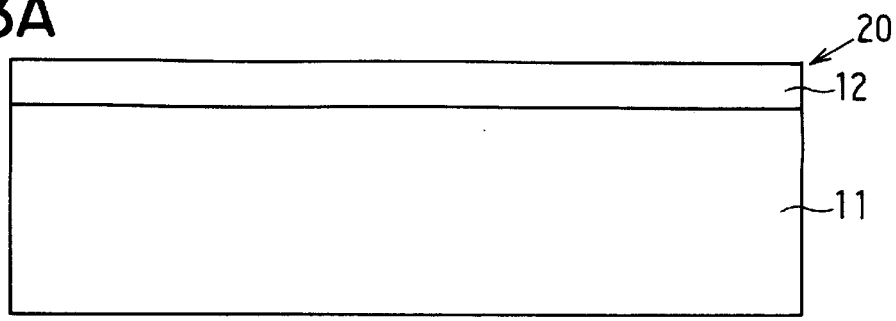

First, as shown in FIG. 3A, a wafer 20 composed of the P-type silicon substrate 11 and the N-type epitaxial layer 12 formed on the P-type silicon substrate 11 is prepared. Next, in a step shown in FIG. 3B, an oxide film 15 is formed on the N-type epitaxial layer 12 and is patterned for forming the element isolation regions. Then, trenches 16 are formed by dry-etching at a depth sufficient for penetrating the N-type epitaxial layer 12 and reaching inside the P-type silicon substrate 11.

Figure 3B:
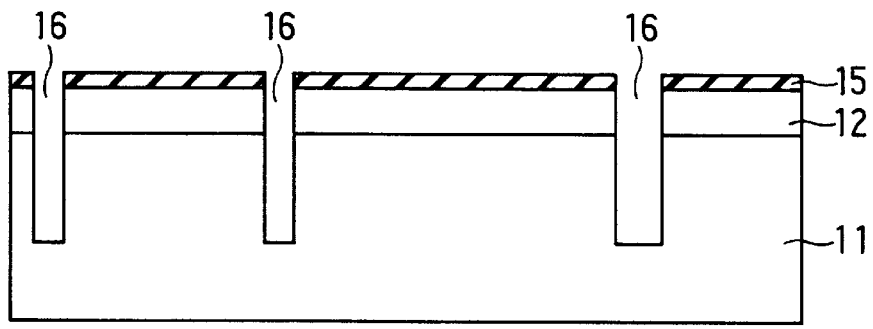
Figure 3C:
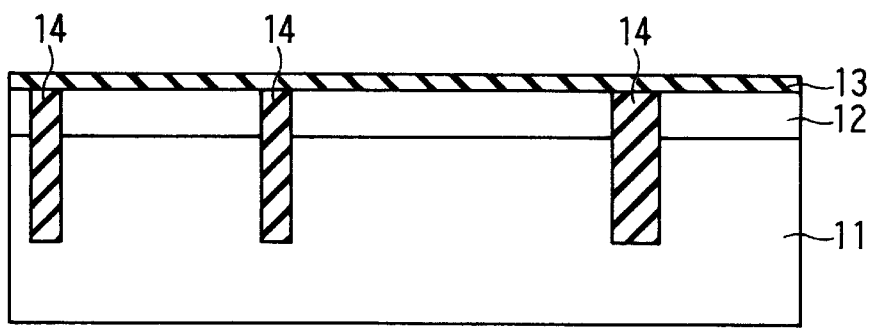

Then, in a step shown in FIG. 3C, the trenches 16 are filled with an insulation film such as an oxide film ($SiO_2$), so that the buried insulation film 14 is formed. After the oxide film on the entire surface of the wafer 20 is removed, a thermal oxidation film 13 is formed. Next, in a step shown in FIG. 3D, an opening portion 17 is formed in the thermal oxidation film 13 for electrical connection, and in a step shown in FIG. 4A, the pads 5, 6, 7 and the wiring segments 8a, 8b, 9, 10 are formed from aluminum on the thermal oxidation film 13.

Figure 4A:
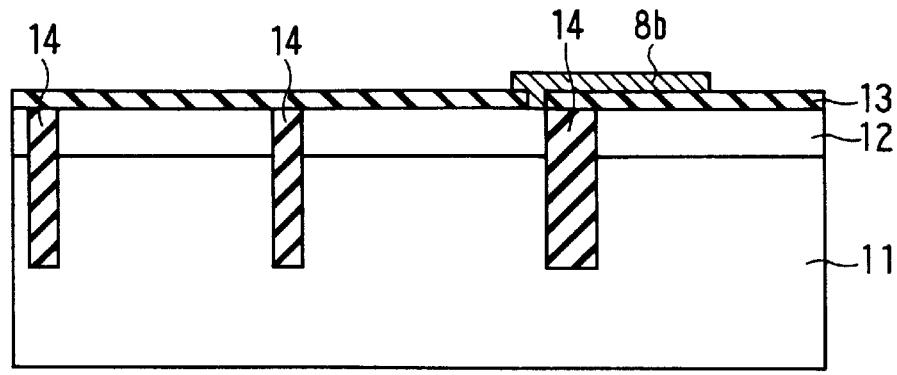
Figure 4B:
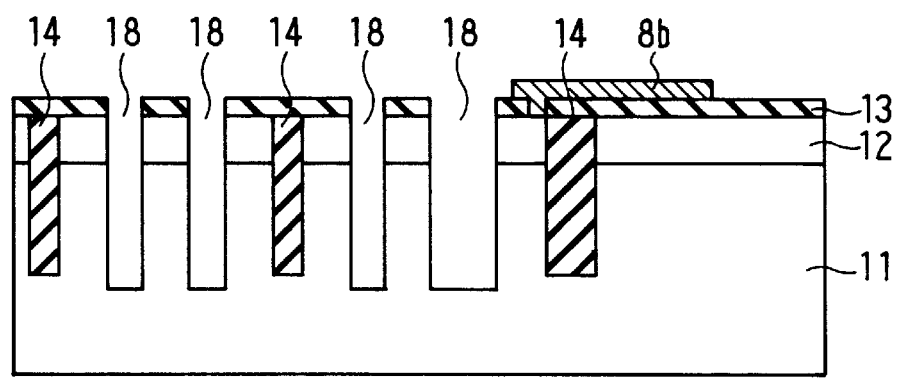
Figure 5:
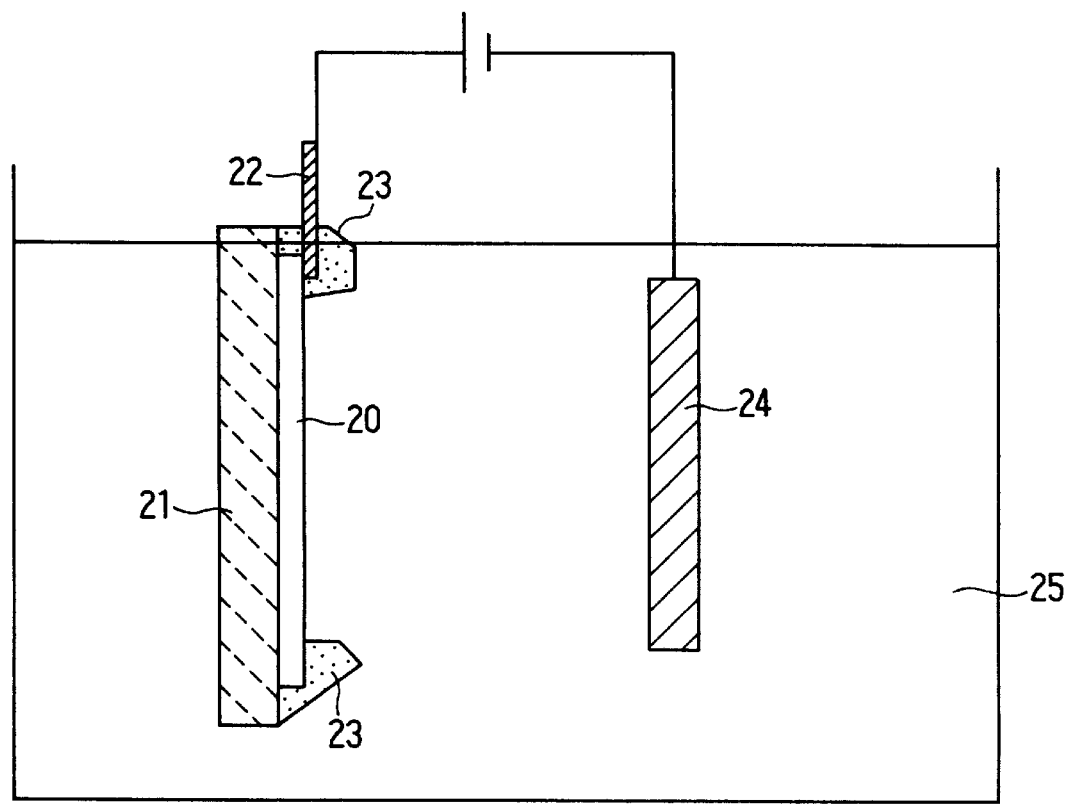
FIG. 5 is a diaphragm showing an electrochemical etching step.

After that, in a step shown in FIG. 4B, trenches are formed using a pattern for settling the beam structure 2. The trenches 18 are, similarly to the trenches 16, formed at a depth sufficient for penetrating the N-type epitaxial layer 12 and for reaching the inside of the P-type silicon substrate 11. After the trenches 18 are formed, electrochemical etching is carried out. That is, as shown in FIG. 5, the back surface of the wafer 20 on a side opposite to the trenches 18 is attached to a ceramic substrate 21 by wax. Then, a Pt wire 22 is connected to an electrode portion, which is formed on the front surface of the wafer 20 to be electrically connected to the pads 5, 6, 7 of each chip, and is fixed by wax 23. In this sate, the wafer is immersed into an anisotropic etching solution 25 such as TMAH solution, and a voltage in a range of 1 V to 20 V is applied between the Pt wire 22 and a Pt wire 24 which is also immersed into the TMAH solution 25. Then, the electrochemical etching is carried out.

Figure 4C:
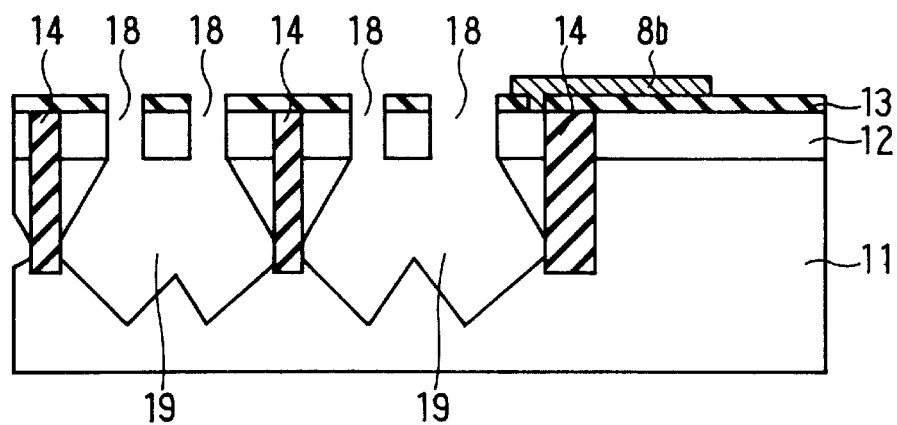

During the electrochemical etching, because a positive voltage is applied to the N-type epitaxial layer 12 in each chip, the N-type epitaxial layer 12 is not etched. Only the P-type silicon substrate 11 is etched by the TMAH solution 25 invading from the trenches 18. Accordingly, as shown in FIG. 4C, cavities 19 are formed in the P-type silicon substrate 11 on the back side of the N-type epitaxial layer 12, and the beam structure 2 including a movable part is formed by the N-type epitaxial layer 12. At that time, because the buried insulation film 14 is not etched, the etched region in a lateral direction, i.e., in a direction parallel to the wafer surface, is restricted by the buried insulation film 14. After the electrochemical etching is carried out in this way, the wafer 20 is cut into respective chips by dicing. As a result, the acceleration sensor shown in FIGS. 1 and 2 is provided.

According to the manufacturing method described above, the etching in the lateral direction is restricted by the buried insulation film 14. Therefore, even if etching conditions such as composition, temperature, and concentration of the etching solution and etching time are varied, the etched region can be constantly provided. In addition, the surface of the P-type silicon substrate 11 exposed in the cavities 19 has irregularities. Accordingly, it becomes difficult for the movable electrodes 2c to be attached to the surface of the P-type silicon substrate 11 in the cavities 19. The beam structure 2 and the fixed electrodes 3, 4 are electrically isolated from the P-type silicon substrate 11 by the buried insulation film 14. Therefore, PN leak current does not occur, resulting in high sensor accuracy.

(Second Embodiment)

Figure 6:
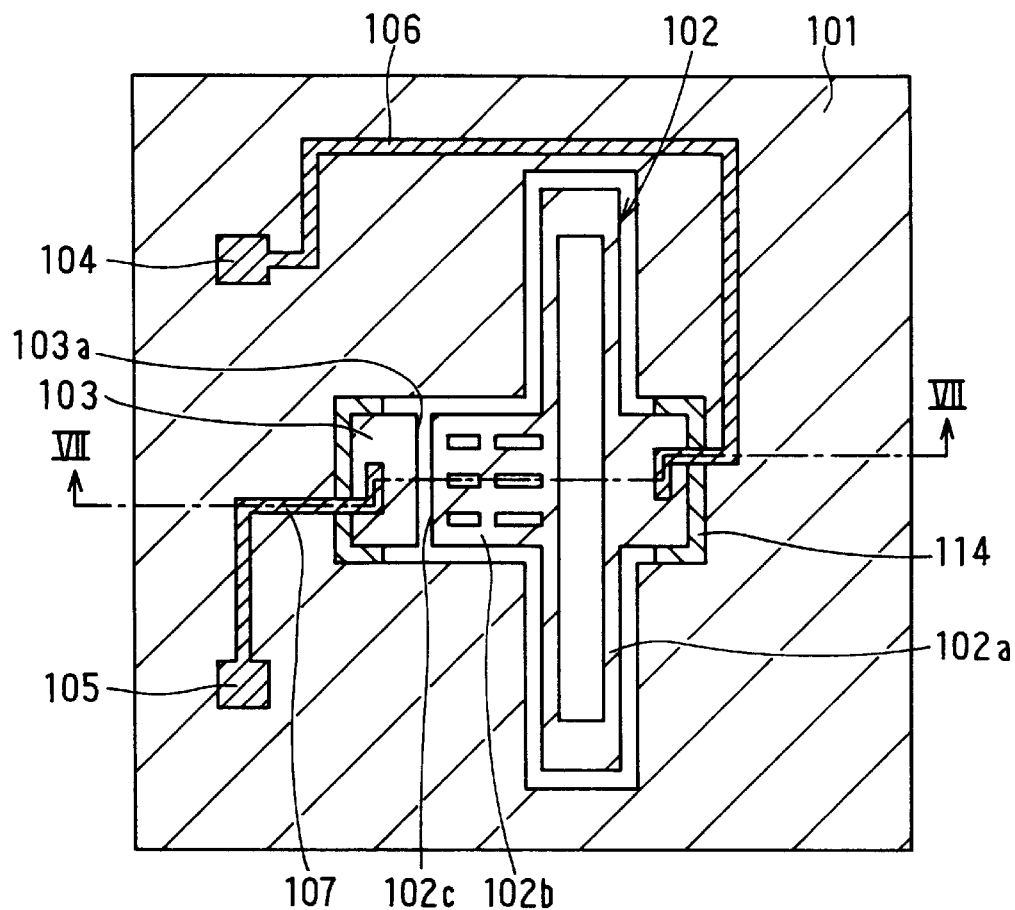
FIG. 6 is a plan view showing a semiconductor acceleration switch in a second preferred embodiment.
Figure 7:
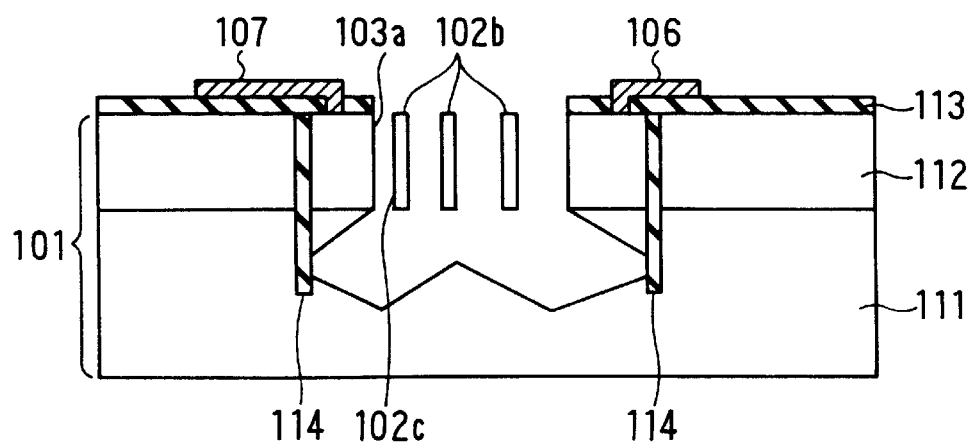
FIG. 7 is cross-sectional view taken along a VII—VII line in FIG. 6.

Referring to FIGS. 6 and 7, a semiconductor acceleration switch in a second preferred embodiment has a beam structure 10 formed by etching a substrate 101. The beam structure 102 has a beam portion 102a and a movable weight electrode 102b. A side face of the movable weight electrode 102b on a left side in the figure serves as a contact portion 102c. A fixed electrode 103 is disposed on the left side of the movable weight electrode 102b. The fixed electrode 103 has a contact portion 103a facing the contact portion 102c of the movable weight electrode 102b.

Aluminum pads 104, 105 and wiring segments 106, 107 are provided on the substrate 101. The pad 104 is electrically connected to the movable weight electrode 102b through the wiring segment 106, while the pad 105 is electrically connected to the fixed electrode 103 through the wiring segment 107. The substrate 101 is, as shown in FIG. 7, composed of a P-type silicon substrate 111, an N-type epitaxial layer 112 formed on the P-type silicon substrate 111 and an oxide film 113 formed on the N-type epitaxial layer 112. Further, a buried insulation film 114 for providing element isolation regions are formed at a base portion (anchor portion) of the beam structure 102 and at portions where the fixed electrode is formed. The beams structure 102 and the fixed electrode 103 are formed by electrochemical etching using the buried insulation film 114 as a stopper. The beam structure 102 and the fixed electrode 103 are supported (fixed) by the buried insulation film 114, and is electrically isolated form the P-type silicon substrate 111.

When the acceleration switch constructed as described above is operated, a specific potential difference is applied between the movable weight electrode 102b and the fixed electrode 103 through the pads 104, 105. In this state, the movable weight electrode 102 is displaced in the left direction in the figure by an acceleration produced in a direction parallel to the surface of the substrate 1. When the contact portion 102c of the movable weight electrode 102b contacts the contact portion 103a of the fixed electrode 103, current flows from the movable weight electrode 102b to the fixed electrode 103. As a result, the acceleration having a magnitude larger than a specific value is detected. The acceleration switch can be manufactured by substantially the same method as in the first embodiment.

(Third Embodiment)

Figure 8:
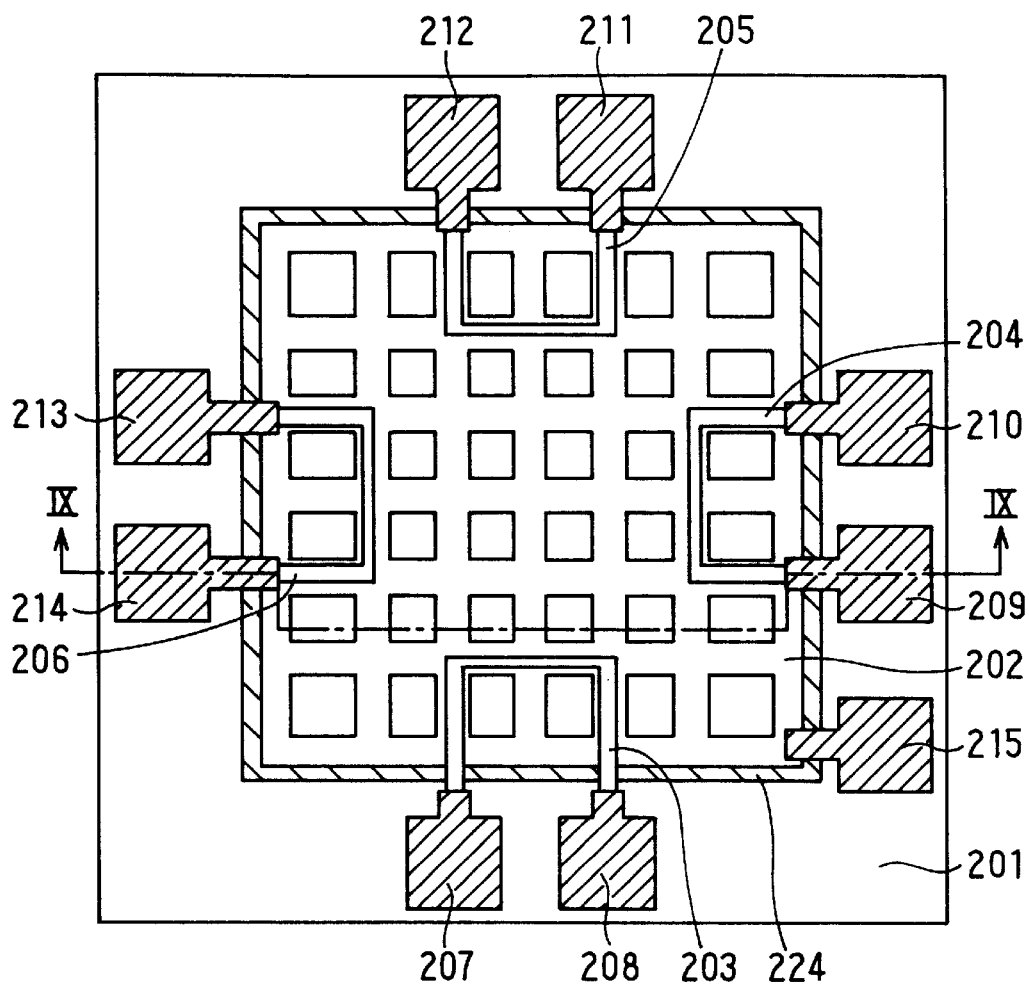
FIG. 8 is a plan view showing a semiconductor pressure sensor in a third preferred embodiment.
Figure 9:
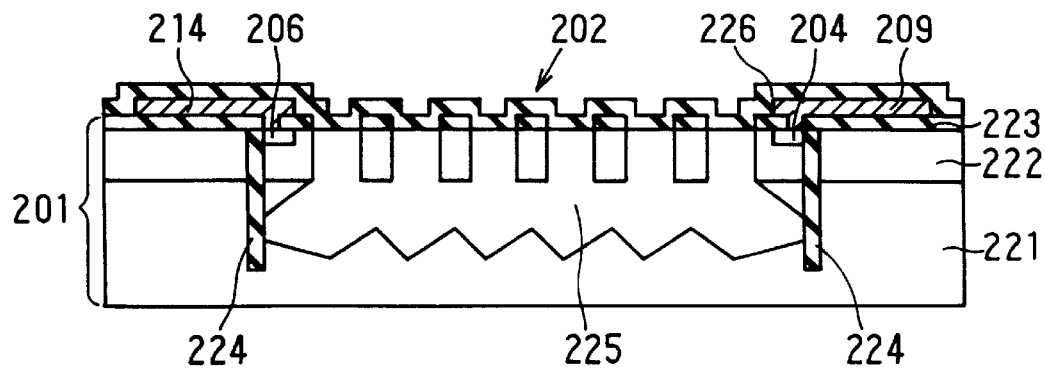
FIG. 9 is a cross-sectional view taken along a IX—IX line in FIG. 8.

Referring to FIGS. 8 and 9, a semiconductor pressure sensor in a third preferred embodiment has an island-like diaphragm portion 202 (displaceable portion) within a substrate 201, and strain gauges 203–206 are formed on the diaphragm portion 202. The strain gauges 203–206 are electrically connected to corresponding two of pads 207 and 208, 209 and 210, 211 and 212, 213 and 214, respectively. A pad 215 is for fixing a potential of the diaphragm portion 202. These pads 207–215 are electrically connected to circuit portions, which are not shown, by wire bonding.

The substrate 201 has, as shown in FIG. 9, an N-type epitaxial layer 222 formed on a P-type silicon substrate 221, and an oxide film 223 formed on the N-type epitaxial layer 221. The substrate 201 has the island-like diaphragm portion 202 having a thin thickness and electrically isolated from the P-type silicon substrate 221 by a buried insulation film 224. A cavity 225 is formed under the diaphragm portion 202. The diaphragm portion 202 is composed of the N-type epitaxial layer 222 and a sealing film 226 formed on the N-type epitaxial layer 222. The cavity 225 is sealed by sealing trenches (described below) formed in the N-type epitaxial layer 222 with the sealing film 226, and serves as a reference pressure chamber. The diaphragm portion 202 is supported by the buried oxide film 224. Accordingly, when a pressure applied to the diaphragm portion 202 varies, the diaphragm portion 202 is displaced so that values of resistance of the strain gauges 203–206 are changed. The pressure is detected based on the changes in value of resistance of the strain gauges 203–206.

Next, a manufacturing method of the pressure sensor described above will be explained referring to FIGS. 10 and 11. Incidentally, the process drawings shown in FIGS. 10, 11 are cross-sectional views taken along the same side as that of FIG. 9.

Figure 10A:
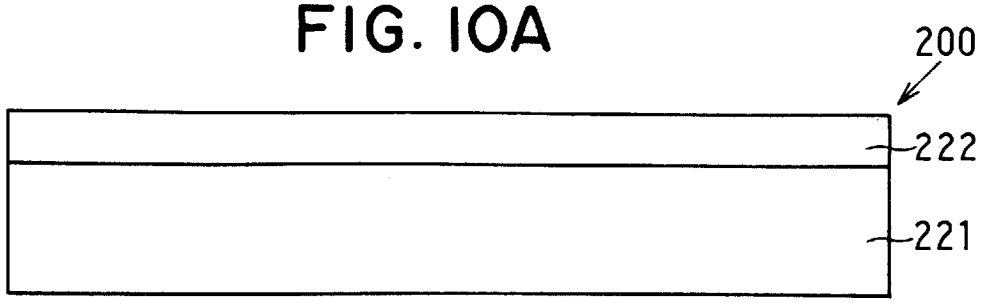
FIGS. 10A–10D and 11A–11D are cross-sectional views showing a manufacturing method of the semiconductor pressure sensor in a stepwise manner in the third embodiment.
Figure 10B:
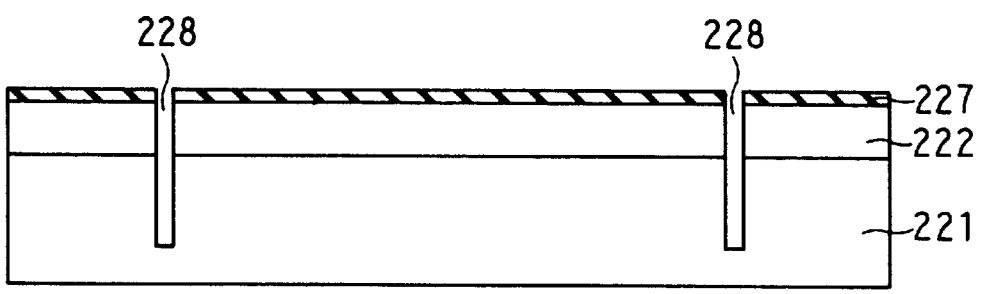

First, as shown in FIG. 10A, a wafer 200 including the N-type epitaxial layer 222 formed on the P-type silicon substrate 221 is prepared. Next, in a step shown in FIG. 10B, an oxide film 227 is formed on the N-type epitaxial layer 222, and is patterned to be open along the outer circumference of a diaphragm region which is to be the diaphragm portion 202. Then, the trench 228 is formed by dry-etching along the outer circumference of the diaphragm region. At that time, the trench 228 is formed to penetrate the N-type epitaxial layer 222 and to reach inside of the P-type silicon substrate 221.

Figure 10C:
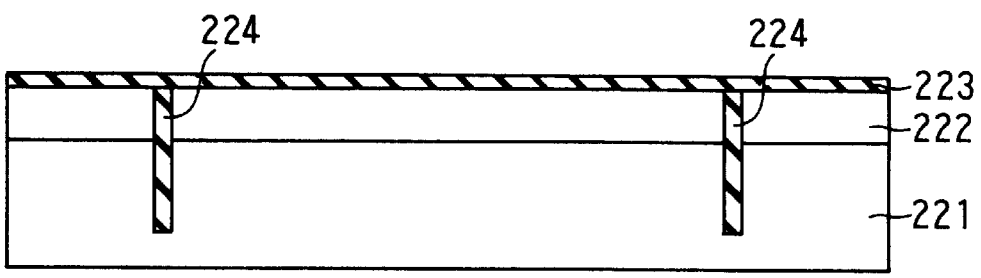
Figure 10D:
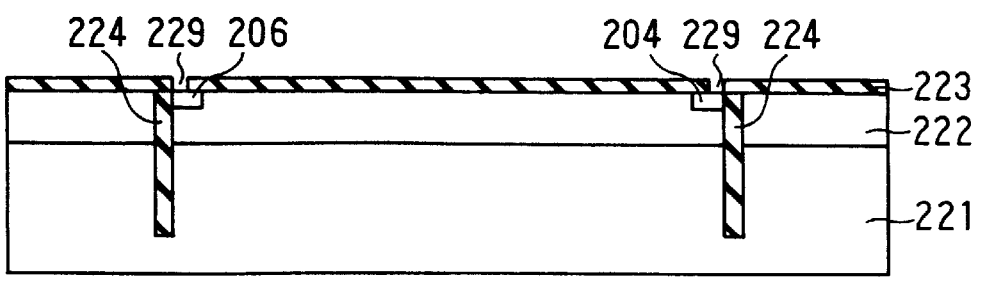

Then, in a step shown in FIG. 10C, the trench 228 is filled with an insulation film such as an oxide film ($SiO_2$), so that the buried insulation film 224 is formed. After the oxide film existing on the entire surface of the wafer 200 is removed, a thermal oxidation film 223 is formed. Next, as shown in FIG. 10D, the strain gauges 203–206 are formed on the diaphragm region by a P-type diffusion layer, and opening portions 229 are formed at portions capable of providing electrical connection with the strain gauges 203–206 and at a portion capable of fixing the potential of the diaphragm portion 202. Then, in a step shown in FIG. 11A, the pads 207–215 are formed.

Figure 11A:
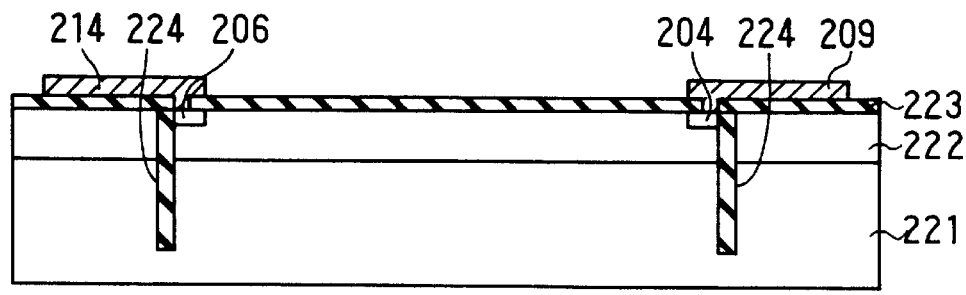
Figure 11B:
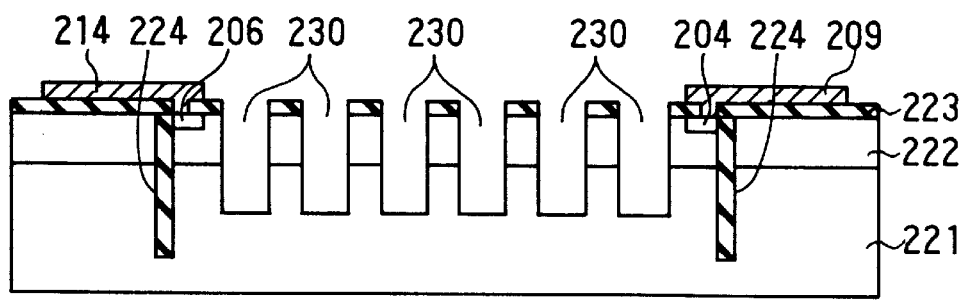
Figure 11C:
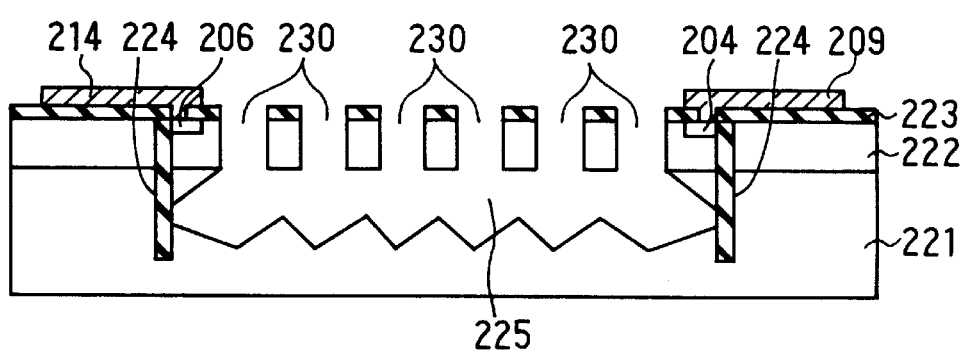
Figure 11D:
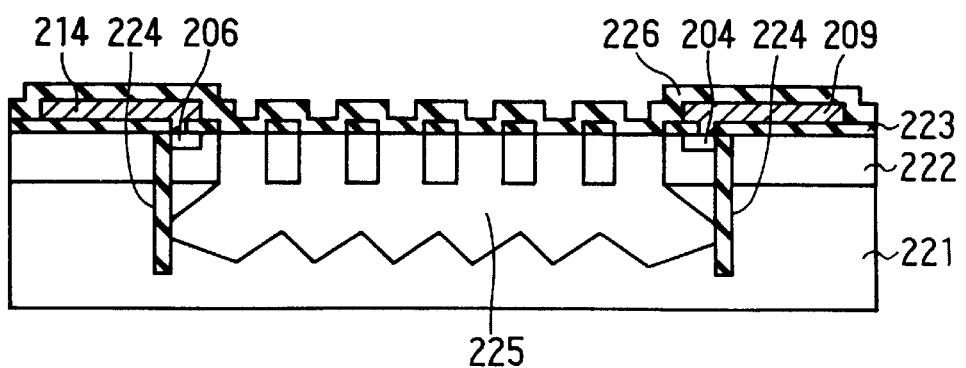

After that, in a step shown in FIG. 11B, several trenches 230 having rectangular patterns shown in FIG. 8 are formed in the diaphragm region. The trenches 230 are formed to penetrate the N-type epitaxial layer 222 and to reach the inside of the P-type silicon substrate 111 similarly to the trench 228. After the trenches 230 are formed, electrochemical etching is carried out substantially in the same manner as that shown in FIG. 5. As a result, as shown in FIG. 1C, the cavity 225 is formed. Then, in a step shown in FIG. 1D, the sealing film 226 is formed on the entire surface of the wafer 200 under decompression. Accordingly, the diaphragm portion 202 and the sealed reference pressure chamber are provided. The sealing film 226 may be an SiN film, an $SiO_2$ film, a TEOS film, a composite film of these materials, or the like. After that, the wafer 200 is cut by dicing, whereby the pressure sensor having the structure shown in FIGS. 8 and 9 is provided.

According to the manufacturing method described above, because the etched region is restricted in the lateral direction, i.e., in a direction parallel to the surface of the wafer 200, by the buried insulation film 224, the area of the diaphragm portion 202 can be controlled. Further, because the diaphragm portion 202 is electrically isolated from the P-type silicon substrate 221 by the buried insulation film 224, PN leak current from the diaphragm portion 202 to the P-type silicon substrate 221 does not occur. Accordingly, the potential of the diaphragm portion 202 can be appropriately maintained so that sufficient sensing accuracy is kept.

Figure 12A:
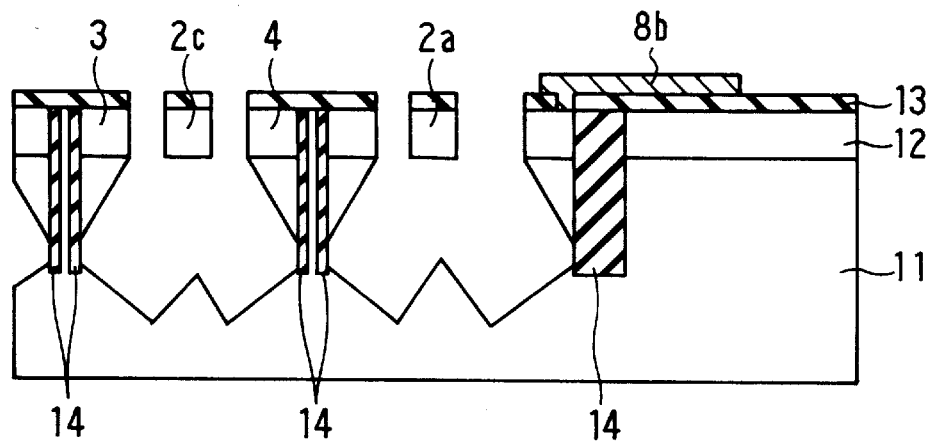
FIGS. 12A–12C are cross-sectional views showing a modified acceleration sensor of the first embodiment.
Figure 12B:
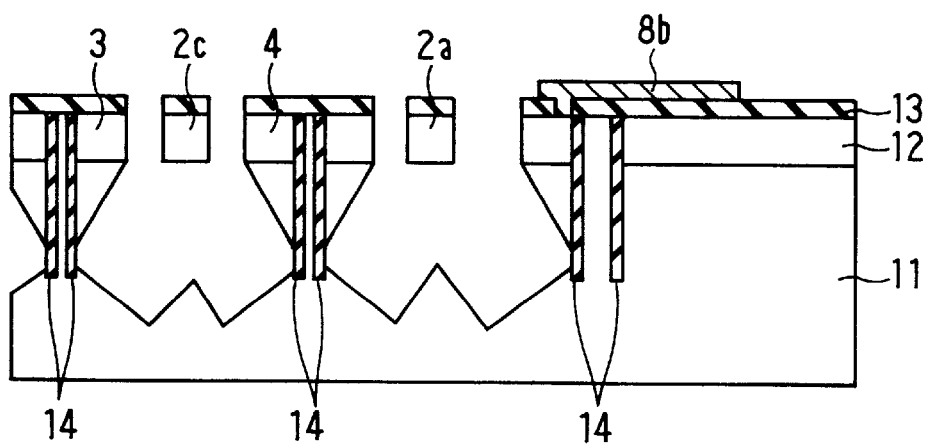
Figure 12C:
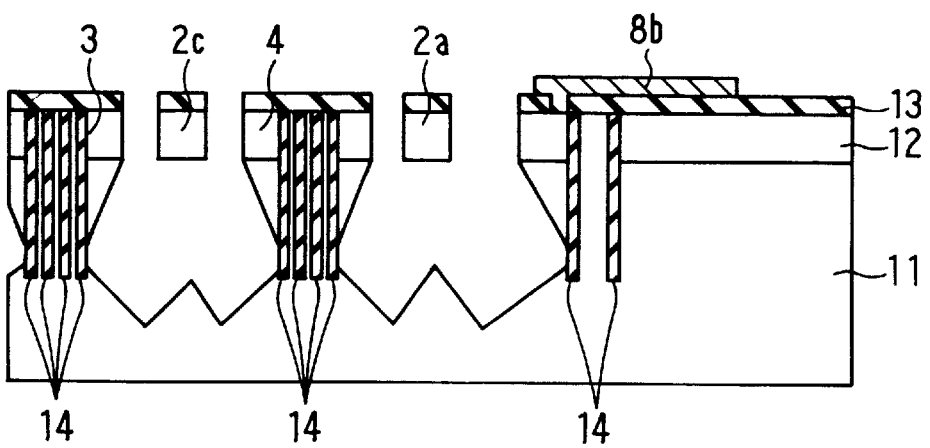

The buried insulation film may be composed of several films provided in parallel with one another to have large strength. For example, in the case of the acceleration sensor in the first and fourth embodiments, as shown in FIGS. 12A–12C, the buried insulation film 14 can be composed of several films. It is the same in the other embodiments. The buried insulation film may be composed of several films to fill one trench.

(Fourth Embodiment)

When the acceleration sensor shown in FIGS. 1, 2 is manufactured through the electrochemical etching step for forming the cavities 19, the wiring segments to which the etchicng voltage is applied are formed on the wafer 20. In a fourth preferred embodiment, the acceleration sensor is manufactured by a method capable of reducing an area of wiring segments for applying the etching voltage. This results in size reduction of each chip.

Figure 3D:
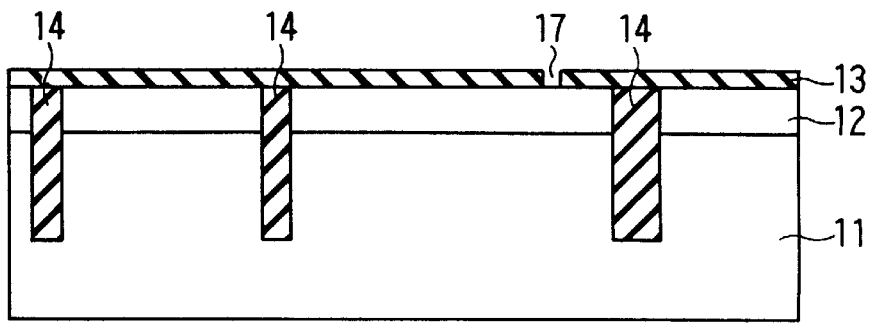

Specifically, in the fourth embodiment, after the steps shown in FIGS. 3A–3C are carried out in substantially the same manner as described in the first embodiment, in the step shown in FIG. 3D, the opening portion 17 is formed in the thermal oxidation film 13. At that time, the thermal oxidation film 13 disposed at regions along scribe lines is not removed. Incidentally, in the subsequent step, the wafer 20 is cut along the scribe lines.

Figure 13:
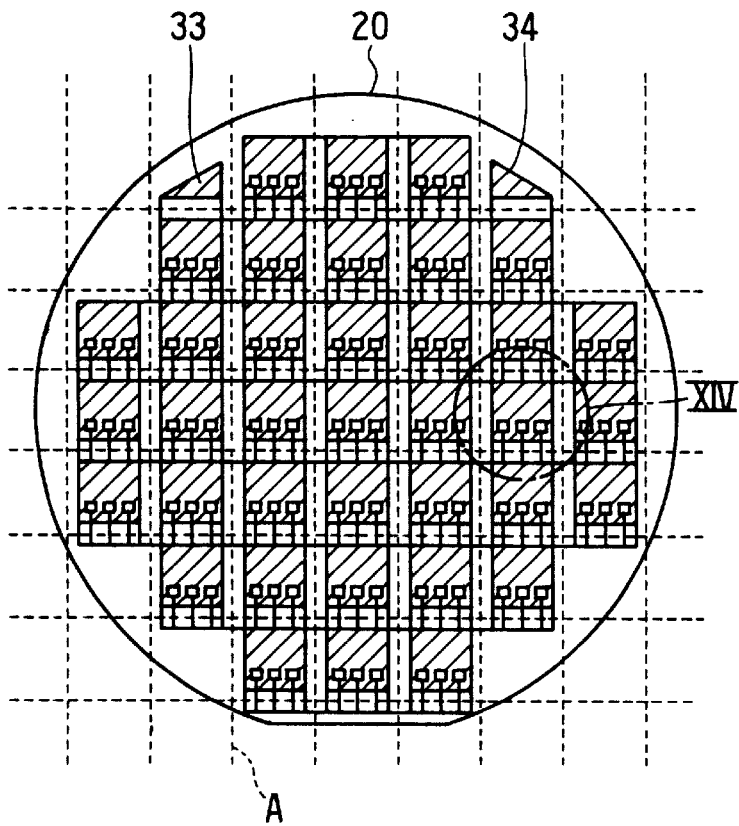
FIG. 13 is a plan view showing a wafer on which pads of chips and wiring segments are formed in a fourth preferred embodiment.
Figure 14:
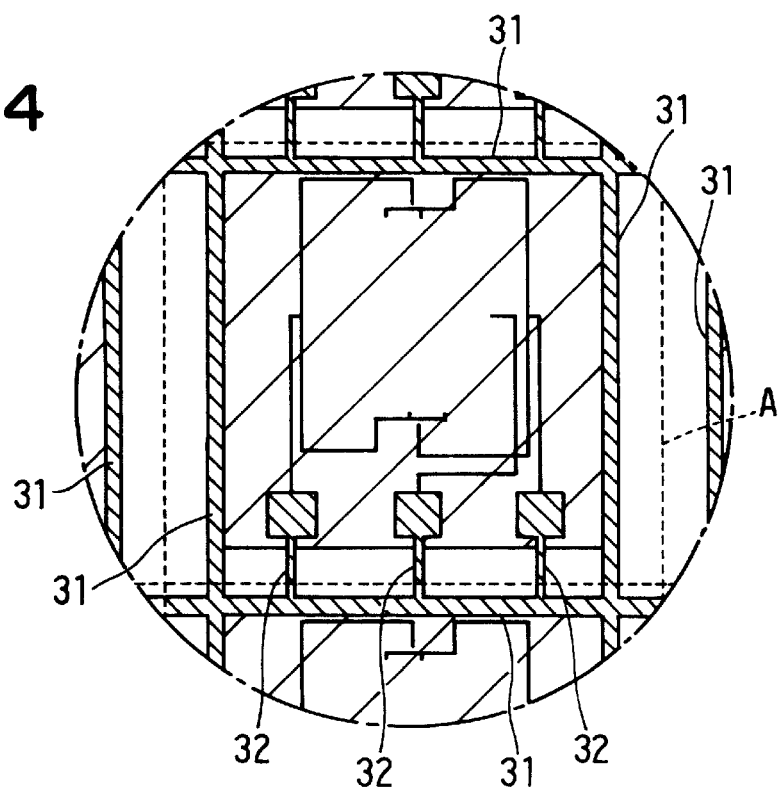
FIG. 14 is an enlarged view showing a portion indicated by a circle XIV in FIG. 13.

Then, in the step shown in FIG. 4A, the pads 5, 6, 7, and the wiring segments 8a, 8b, 9, 10 for the acceleration sensor are formed. At the same time, as shown in FIGS. 13 and 14, wiring segments 31 which are used in the etching step are formed along the scribe lines indicated by dotted lines A in the figures, to surround the chips, and connecting wiring segments 32 are formed to electrically connect the wiring segments 31 to the respective pads 5, 6, 7. Further, as shown in FIG. 13, electrodes 33, 34 are formed at specific portions of the wafer 20 to be connected to the wiring segments 32.

Next, after the trenches 18 are formed in the same manner described above referring to FIG. 4B, the electrochemical etching is carried out. In this step, as shown in FIG. 5, the back surface of the wafer 20 is attached to the ceramic substrate 21 by wax. Then, the Pt wire 22 is connected to one of electrodes 33, 34 formed on the front surface of the wafer 20 and is fixed to the electrode by the wax 23 to electrically communicate with one another. Then, the wafer 20 is immersed into the anisotropic etching solution such as TMAH solution 25, and a voltage in a range of approximately 1 V to 20 V is applied between the Pt wire 22 and the Pt wire 24 immersed in the TMAH solution 25 SO that the electrochemical etching is carried out.

Figure 15:
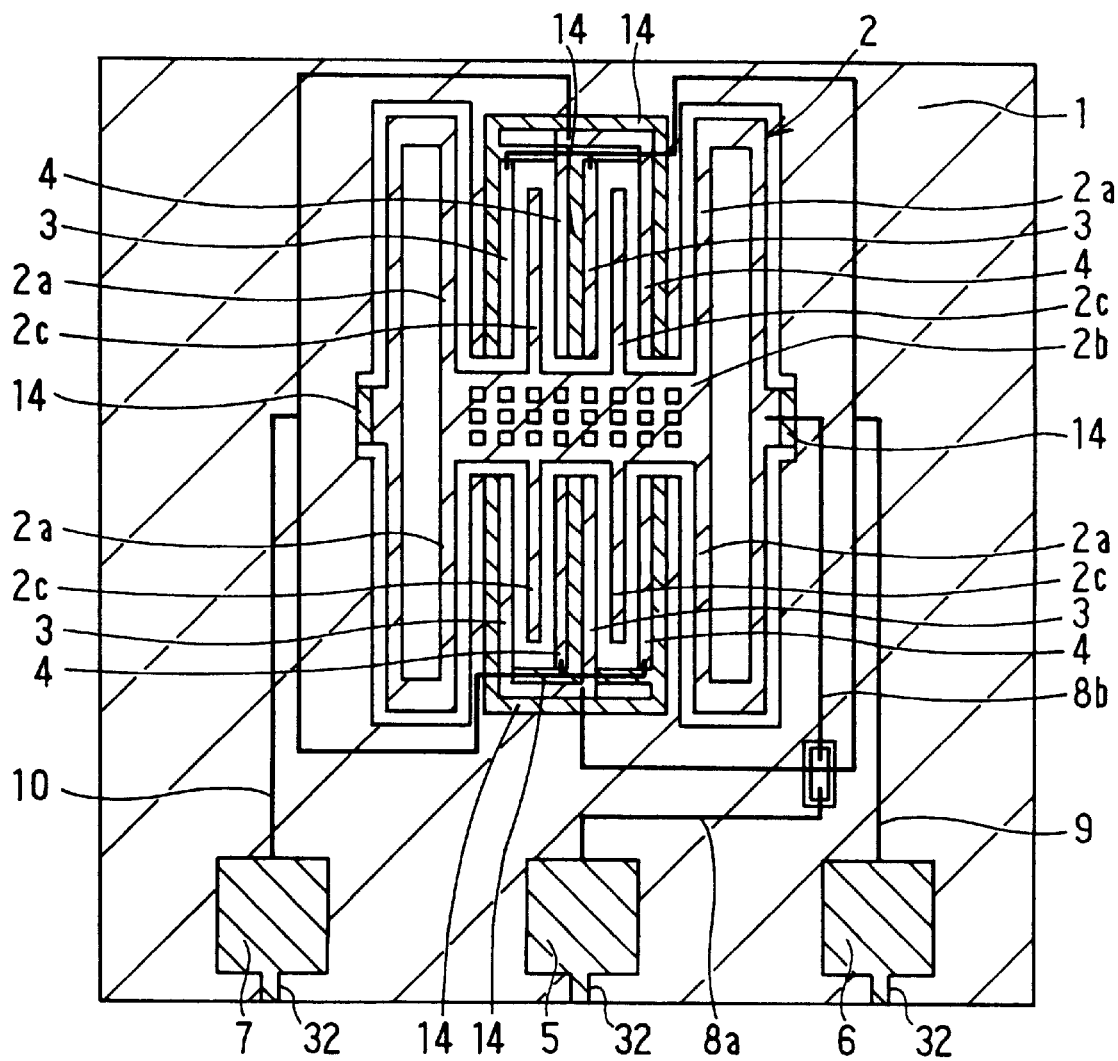
FIG. 15 is a plan view showing an acceleration sensor manufactured by a method in the fourth embodiment.

In this case, because a positive voltage is applied to the N-type epitaxial layer 12 of each chip through the Pt wire 22, the electrodes 33 or 34, the wiring segments 32, 31, and the pads 5, 6, 7, the N-type epitaxial layer is not etched. On the other hand, the P-type silicon substrate 11 is etched by the TMAH solution 25 invading from the trenches 18. Accordingly, as shown in FIG. 4C, the cavities 19 are formed in the P-type silicon substrate 11 under the N-type epitaxial layer 12, so that the beam structure 2 is formed by the N-type epitaxial layer 12. After the electrochemical etching is carried out, the wafer is cut by dicing along the scribe lines shown in FIG. 13. As a result, the acceleration sensor shown in FIG. 15 is obtained. In the dicing step, because the wiring segments 31, 32 formed at the regions along the scribe lines are cut, the pads 5, 6, 7 are electrically isolated from one another.

According to the manufacturing method in the fourth embodiment, the positive voltage is applied to the pads 5, 6, 7 in the electrochemical etching step through the wiring segments 31, 32 formed at the regions along the scribe lines. Therefore, the area necessary for the wiring segments which are used in the electrochemical etching step for applying the voltage is significantly reduced. The other features and effects are the same as those in the first embodiment.

Figure 16:
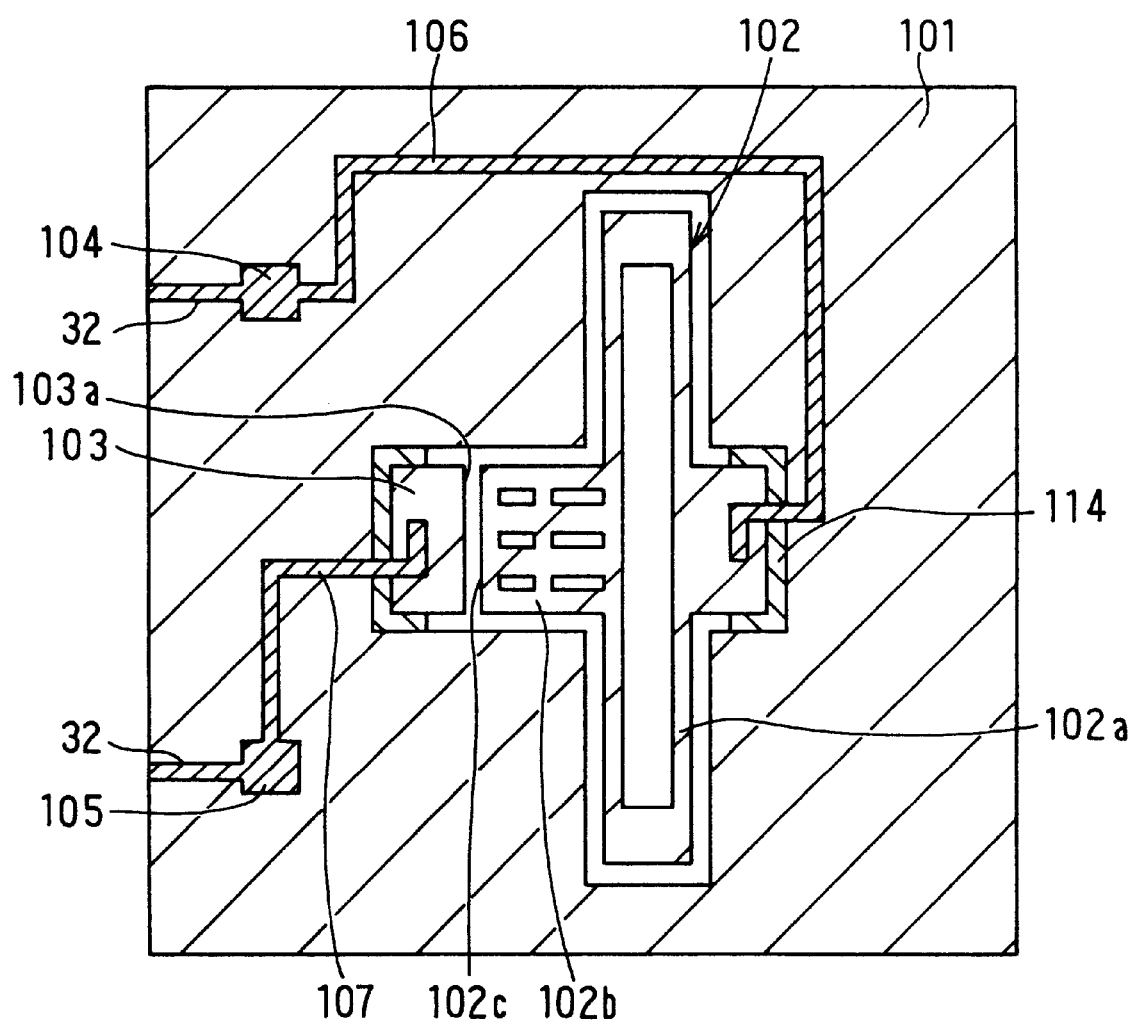
FIG. 16 is a plan view showing an acceleration switch manufactured by the method in the fourth embodiment.

Incidentally, the acceleration switch in the second embodiment can be manufactured in substantially the same manner as described above. In this case, when the beam structure 102 is formed by the electrochemical etching step, the positive voltage is applied to the pads 104, 105 through the wiring members 31, 32, which are also formed at the regions along the scribe lines in the same manner shown in FIGS. 13 and 14. The thus obtained acceleration switch is shown in FIG. 16.

(Fifth Embodiment)

Figure 17:
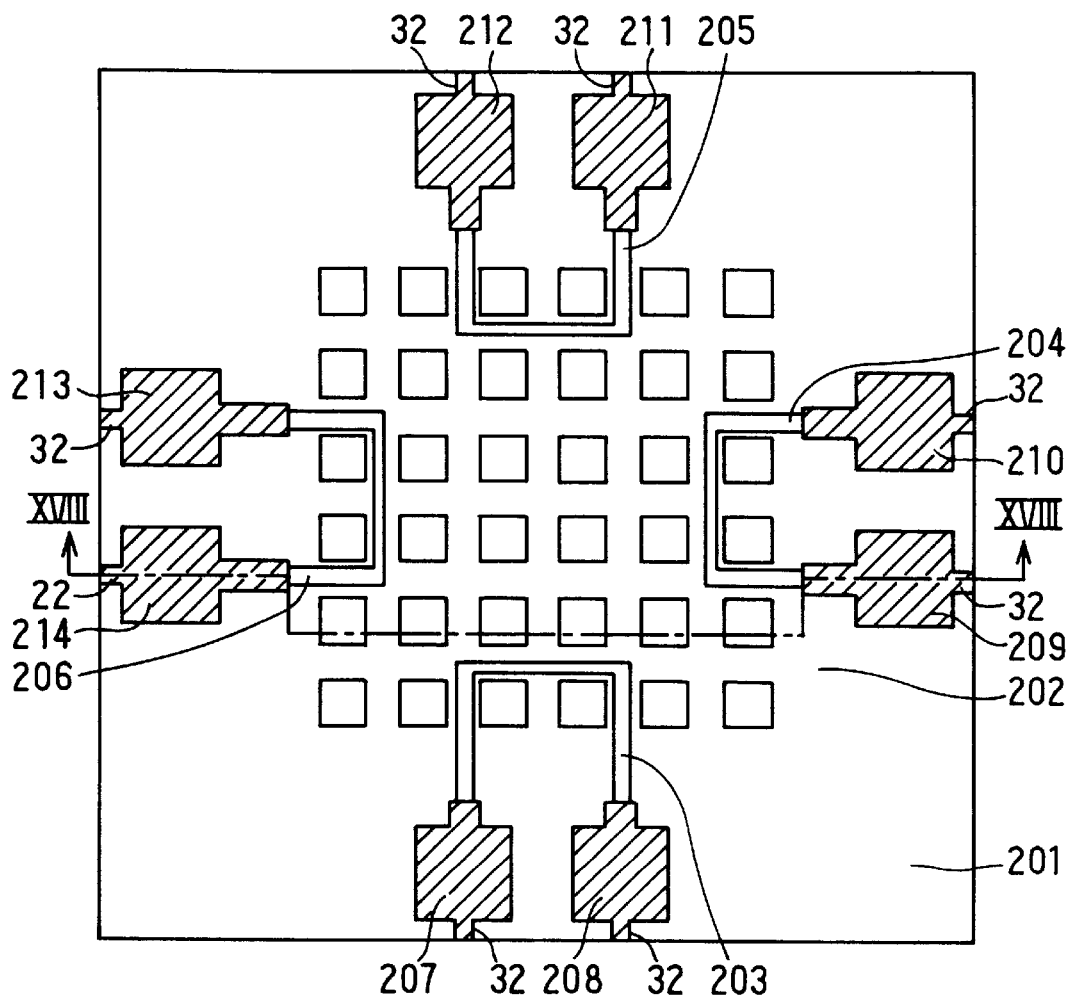
FIG. 17 is a plan view showing a pressure sensor manufactured in a method in a fifth preferred embodiment.
Figure 18:
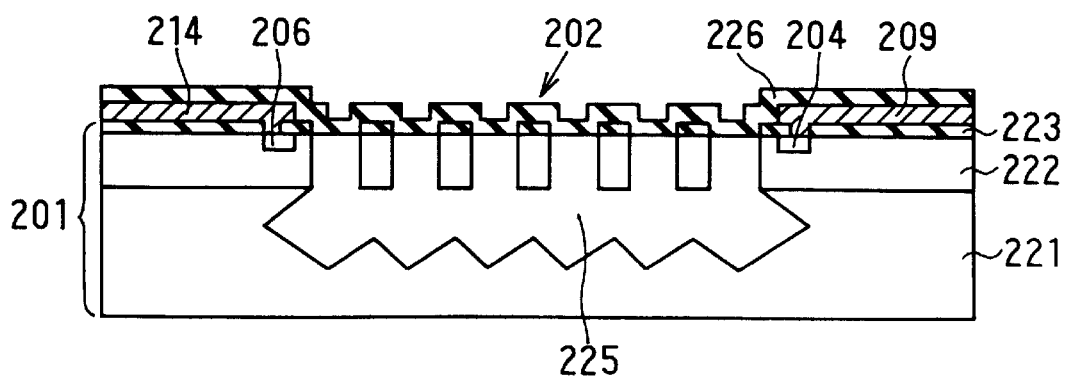
FIG. 18 is a cross-sectional view taken along a XVIII—XVIII line in FIG. 17.

In a fifth preferred embodiment, the method in the fourth embodiment is used for forming a semiconductor pressure sensor shown in FIGS. 17 and 18. In FIGS. 17 and 18, the same parts as those in FIGS. 8 and 9 are indicated with the same reference numerals. The same descriptions will not be reiterated.

Specifically, a method for manufacturing the pressure sensor in the fifth embodiment will be explained referring to FIGS. 19A–19E. Incidentally, FIGS. 19A–19E show cross-sectional views taken along the same line as that of FIG. 18.

Figure 19A:
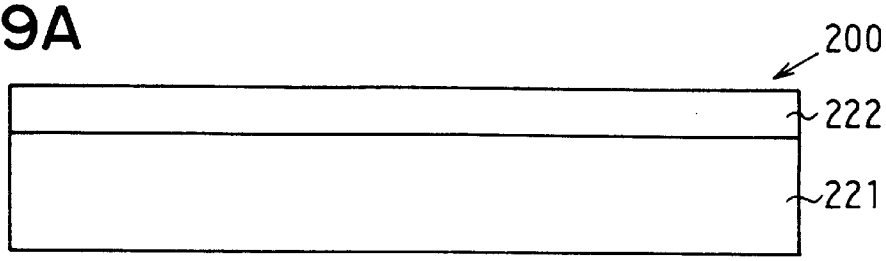
FIGS. 19A–19E are cross-sectional views showing the method of manufacturing the pressure sensor in the fifth embodiment.
Figure 19B:
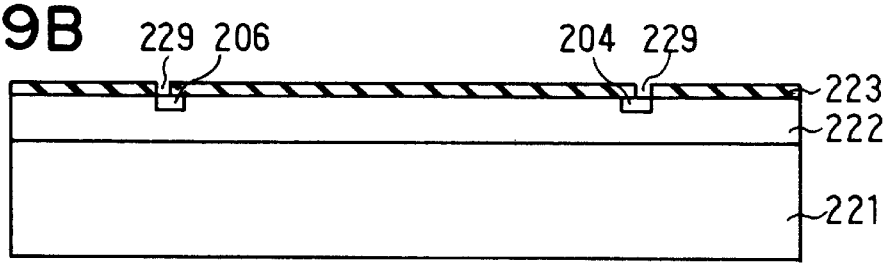

First, as shown in FIG. 19A, the wafer 200 composed of the P-type silicon substrate 221 and the N-type epitaxial layer 222 formed on the P-type silicon substrate 221 is prepared as in the third embodiment. Next, in a step shown in FIG. 19B, the oxide film 223 is formed on the N-type epitaxial layer 222, and the strain gauges 203–206 are formed by the P-type diffusion layer at the diaphragm region where the diaphragm portion 202 is to be provided. Then, opening portions 229 are formed at portions capable of providing electrical connection with the strain gauges 203–206 and of fixing the potential of the diaphragm portion 202. At that time, the oxide film disposed on the regions along the scribe line is not removed.

Figure 19C:
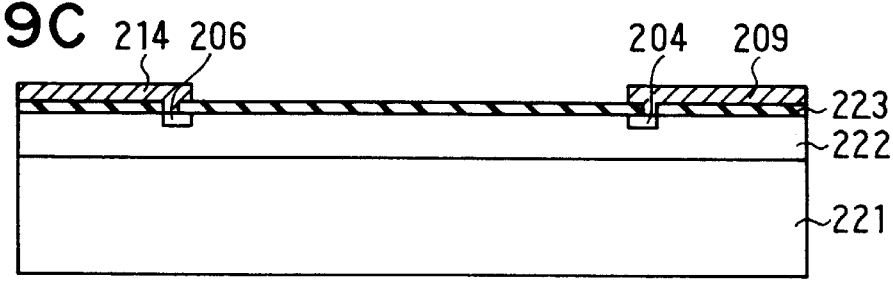

Then, in a step shown in FIG. 19C, pads 207–214 are formed from aluminum. In this step, as shown in FIGS. 13 and 14, the wiring segments 31 are formed along the scribe lines to surround the chips, and at the same time, the wiring segments 32 are formed to connect the wiring segments 31 and the pads 207–214 of the respective chips. Further, electrodes 33, 34 are formed at specific portions of the wafer to be connected to the wiring segments 31.

Figure 19D:
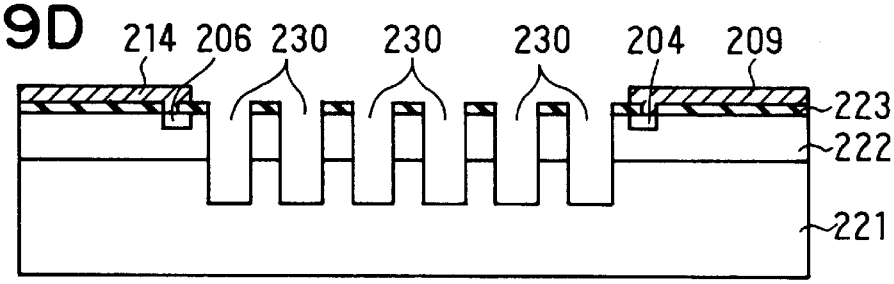
Figure 19E:
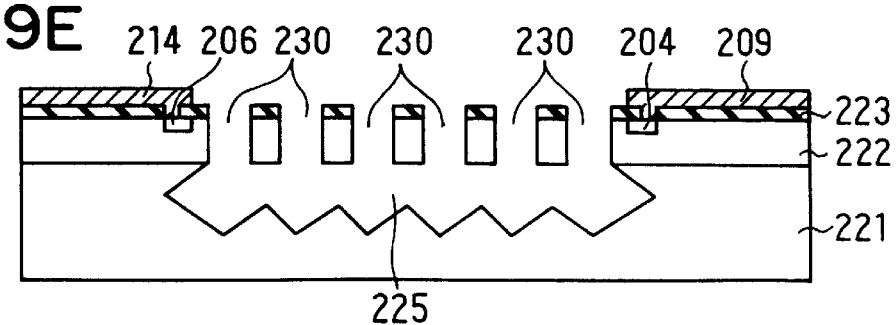

After that, in a step shown in FIG. 19D, several trenches 230 having rectangular patterns shown in FIG. 17 are formed in the diaphragm region. The trenches 230 are formed to penetrate the N-type epitaxial layer 222 and to reach the inside of the P-type silicon substrate 111. After the trenches 230 are formed, electrochemical etching is carried out substantially in the same manner as that in the fourth embodiment. As a result, as shown in FIG. 19E, the cavity 225 is formed. Then, the sealing film 226 is formed on the entire surface of the wafer 200 under decompression to seal the cavity 225. Accordingly, the diaphragm portion 202 and the sealed reference pressure chamber are provided. The sealing film 226 may be an SiN film, an $SiO_2$ film, a TEOS film, a composite film of these materials, or the like.

After that, the wafer 200 is cut by dicing, whereby the pressure sensor having the structure shown in FIGS. 17 and 18 is provided. At that time, because the wiring segments 31, 32 are cut, the pads 207–214 are electrically insulated from one another.

Figure 20:
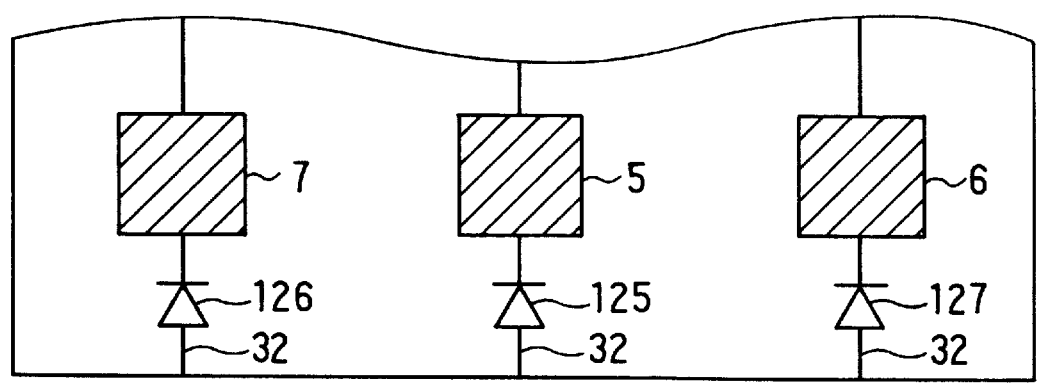
FIG. 20 is a schematic view showing a modified arrangement of pads and wiring segments of the acceleration sensor in the fourth embodiment.

The wiring segments 32 connected to the pads 5–7 or 207–214 may be connected to diodes in the chips so that leak current from the wiring segments 32 can be prevented from flowing toward sensor end portiones when the sensor is operated. For example, as shown in FIG. 20, in the acceleration sensor of the fourth embodiment, the wiring segments 32 can be connected to the respective pads 5–7 via diodes 125–127.

In the embodiments described above, the wafer composed of the P-type silicon substrate and the epitaxial layer formed on the P-type silicon substrate is used; however, a wafer composed of an N-type silicon substrate and a P-type epitaxial layer formed on the N-type silicon substrate may be used. The etching solution for the electrochemical etching step may be KOH solution or HF solution in addition to the TMAH solution. However, in this case, because aluminum is etched, the pads and the wiring segments need be masked during the etching step. It is apparent that the present invention can be applied to an angular speed sensor in addition to the acceleration sensor, the acceleration switch, and the pressure sensor described above.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor physical quantity sensor for detecting a physical quantity, the sensor comprising:
   a P-type semiconductor substrate;
   an N-type semiconductor layer formed on a main surface of the P-type semiconductor substrate;
   a buried insulation film penetrating the N-type semiconductor layer and extending into the P-type semiconductor substrate; and
   a displaceable portion for being displaced by the physical quantity, the displaceable portion being formed by electrochemically etching the P-type semiconductor substrate from a side of the main surface using the buried insulation film as a stopper.

2. The semiconductor physical quantity sensor of claim 1, wherein the displaceable portion is electrically isolated from the P-type semiconductor substrate by the buried insulation film.

3. The semiconductor physical quantity sensor of claim 2, wherein:
   the displaceable portion includes a movable electrode facing the N-type semiconductor layer with a gap;
   the N-type semiconductor layer includes a fixed electrode at a position facing the movable electrode and isolated from the P-type semiconductor substrate by the buried insulation film; and
   the displaceable portion is displaced so that the movable electrode contacts the fixed electrode when the physical quantity larger than a specific amount is applied to the displaceable portion.

4. The semiconductor physical quantity sensor of claim 1, wherein the displaceable portion is supported by the buried insulation film.

5. The semiconductor physical quantity sensor of claim 1, wherein the buried insulation film includes a plurality of insulation films extending in parallel with one another in a direction perpendicular to the main surface of the P-type semiconductor substrate.

6. The semiconductor physical quantity sensor of claim 1, wherein:
   the physical quantity is a pressure;
   the displaceable portion is a diaphragm portion; and
   the buried insulation film surrounds the diaphragm portion so that the diaphragm portion is electrically isolated from the P-type semiconductor substrate.

7. A semiconductor physical quantity sensor for detecting a physical quantity, comprising:
   a semiconductor substrate having a cavity;
   a semiconductor layer disposed on a main surface of the semiconductor substrate and having a reverse conductive type relative to the semiconductor substrate;
   a buried insulation film extending perpendicularly to the main surface of the semiconductor substrate from a surface of the semiconductor layer into the semiconductor substrate, and dividing the semiconductor layer into a first part facing the cavity and electrically isolated from the semiconductor substrate and a second part provided on a side opposite to the first part with respect to the buried insulation film; and
   a displaceable portion disposed above the cavity and connected to the first part of the semiconductor layer, for being displaced upon receiving the physical quantity.

8. The semiconductor physical quantity sensor of claim 7, wherein:
   the semiconductor substrate is a P-type;
   the semiconductor layer is an N-type; and
   the cavity and the displaceable portion are formed by electrochemical etching using the buried insulation film as a stopper.

9. The semiconductor physical quantity sensor of claim 7, wherein:
   the semiconductor layer includes a fixed electrode facing the displaceable portion with a gap and electrically isolated from the semiconductor substrate by the buried insulation film;
   the displaceable portion includes a movable electrode facing the fixed electrode, the movable electrode being for contacting the fixed electrode when the displaceable portion is displaced by the physical quantity larger than a specific amount.

10. The semiconductor physical quantity sensor of claim 7, wherein:
    the physical quantity is a pressure;
    the displaceable portion is a diaphragm portion composed of a first thin film having a hole communicating with the cavity and a second thin film disposed on the first thin film and sealing the cavity; and
    the buried insulation film surrounds the diaphragm portion so that the diaphragm portion is electrically isolated from the semiconductor substrate.

* * * * *